(12) United States Patent
Huisman et al.

(10) Patent No.: US 12,326,669 B2
(45) Date of Patent: Jun. 10, 2025

(54) ILLUMINATION APPARATUS AND ASSOCIATED METROLOGY AND LITHOGRAPHIC APPARATUSES

(71) Applicant: ASML Netherlands B.V., Veldhoven (NL)

(72) Inventors: Simon Reinald Huisman, Eindhoven (NL); Arjan Johannes Anton Beukman, Son en Breugel (NL); Arie Jeffrey Den Boef, Waalre (NL); Sebastianus Adrianus Goorden, Eindhoven (NL); Nitish Kumar, Eindhoven (NL); Jin Lian, Eindhoven (NL); Zili Zhou, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 113 days.

(21) Appl. No.: 18/151,334

(22) Filed: Jan. 6, 2023

(65) Prior Publication Data
US 2023/0229094 A1    Jul. 20, 2023

Related U.S. Application Data

(63) Continuation of application No. PCT/EP2021/065681, filed on Jun. 10, 2021.

(51) Int. Cl.
*G03F 7/00*    (2006.01)
*G02B 26/08*    (2006.01)
(Continued)

(52) U.S. Cl.
CPC ....... *G03F 9/7065* (2013.01); *G02B 26/0833* (2013.01); *G02B 27/283* (2013.01); *G03F 7/70575* (2013.01); *G03F 7/70616* (2013.01)

(58) Field of Classification Search
CPC ............... G03F 9/7065; G03F 7/70575; G03F 7/70616; G02B 26/0833; G02B 27/283;
(Continued)

(56) References Cited

U.S. PATENT DOCUMENTS

| 6,961,116 B2 | 11/2005 | Den Boef et al. |
| 2005/0040146 A1* | 2/2005 | Takami ............. H01L 21/02691 257/E29.294 |

(Continued)

FOREIGN PATENT DOCUMENTS

| TW | 201826040 A | 7/2018 |
| WO | WO 2009/078708 A1 | 6/2009 |

(Continued)

OTHER PUBLICATIONS

International Search Report issued in related PCT International Application No. PCT/EP2021/065681; mailed Sep. 27, 2021 (2 pgs.).

(Continued)

*Primary Examiner* — Mesfin T Asfaw
(74) *Attorney, Agent, or Firm* — Finnegan, Henderson, Farabow, Garrett & Dunner, LLP (57) ABSTRACT

Disclosed is an illumination arrangement for spectrally shaping a broadband illumination beam to obtain a spectrally shaped illumination beam. The illumination arrangement comprises a beam dispersing element for dispersing the broadband illumination beam and a spatial light modulator for spatially modulating the broadband illumination beam subsequent to being dispersed. The illumination arrangement further comprises at least one of a beam expanding element for expanding said broadband illumination beam in at least one direction, located between an input of the illumination arrangement and the spatial light modulator; and a lens array, each lens of which for directing a (Continued)

respective wavelength band of the broadband illumination beam subsequent to being dispersed onto a respective region of the spatial light modulator.

19 Claims, 6 Drawing Sheets

(51) Int. Cl.
  *G02B 27/28* (2006.01)
  *G03F 9/00* (2006.01)
(58) Field of Classification Search
  CPC ............ G02B 27/1006; G02B 27/1086; G02B 27/126
  See application file for complete search history.

(56) References Cited

U.S. PATENT DOCUMENTS

| | | |
|---|---|---|
| 2006/0033921 A1 | 2/2006 | Den Boef et al. |
| 2006/0066855 A1 | 3/2006 | Boef et al. |
| 2006/0152810 A1* | 7/2006 | Kvamme ......... G01N 21/95623 359/567 |
| 2009/0167963 A1 | 7/2009 | Kwon et al. |
| 2009/0195768 A1 | 8/2009 | Bijnen et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0250088 A1* | 9/2013 | Osipchuk ........... G02B 21/0076 348/79 |
| 2013/0258310 A1 | 10/2013 | Smilde et al. |
| 2013/0271740 A1 | 10/2013 | Quintanilha |
| 2014/0268127 A1 | 9/2014 | Day |
| 2015/0355554 A1 | 12/2015 | Mathijssen |
| 2017/0350575 A1* | 12/2017 | Hill ........................... G01J 3/12 |
| 2019/0094721 A1 | 3/2019 | Tinnemans et al. |
| 2020/0192231 A1 | 6/2020 | Cramer et al. |

FOREIGN PATENT DOCUMENTS

| | | |
|---|---|---|
| WO | WO 2009/106279 A1 | 9/2009 |
| WO | WO 2013/178422 A1 | 12/2013 |
| WO | WO 2015/051970 A1 | 4/2015 |
| WO | WO 2018/114152 A1 | 6/2018 |
| WO | WO 2020/057900 A1 | 3/2020 |
| WO | WO 2021/001102 A1 | 1/2021 |
| WO | WO 2021/032400 A1 | 2/2021 |
| WO | WO 2022/008160 A1 | 1/2022 |

OTHER PUBLICATIONS

Office Action of the Intellectual Property Office of Taiwan issued in related Taiwanese Patent Application No. 110123055; mailed May 12, 2022 (10 pgs.).

* cited by examiner

ILLUMINATION APPARATUS AND ASSOCIATED METROLOGY AND LITHOGRAPHIC APPARATUSES

CROSS-REFERENCE TO RELATED APPLICATIONS

This application claims priority of International application PCT/EP2021/065681, which was filed on 10 Jun. 2021 and claims priority of EP Application Serial No. 20184306.7, which was filed on 6 Jul. 2020. These applications are incorporated herein by reference in their entireties.

FIELD

The embodiments of the present disclosure relate to methods and apparatus usable, for example, in the manufacture of devices by lithographic techniques, and to methods of manufacturing devices using lithographic techniques. The embodiments of the present disclosure relate more particularly to metrology sensors and lithography apparatuses having such a metrology sensor.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1. US20120044470A. US20120123581A. US20130258310A. US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In some metrology applications, such as in some scatterometers or alignment sensors, imperfections in metrology targets can result in a wavelength/polarization dependent variation in a measured value from that target. As such, correction and/or mitigation for this variation is sometimes effected by performing the same measurement using multiple different wavelengths and/or polarizations (or more generally, multiple different illumination conditions). It would be desirable to improve switching and selection of the spectral components of illumination for such metrology applications.

SUMMARY

The embodiments of the present disclosure provide an illumination arrangement for spectrally shaping a broadband illumination beam to obtain a spectrally shaped illumination beam, comprising: a beam dispersing element for dispersing the broadband illumination beam; a spatial light modulator for spatially modulating the broadband illumination beam subsequent to being dispersed; and at least one of: a beam expanding element for expanding said broadband illumination beam in at least one direction, located between an input of the illumination arrangement and the spatial light modulator; and a lens array, each lens of which for directing a respective wavelength band of the broadband illumination beam subsequent to being dispersed onto a respective region of the spatial light modulator.

Also disclosed is a metrology apparatus and a lithographic apparatus comprising a metrology device being operable to perform a corresponding method consistent with the disclosed embodiments.

The above and other aspects will be understood from a consideration of the examples described below.

BRIEF DESCRIPTION OF THE DRAWINGS

Embodiments will now be described, by way of example only, with reference to the accompanying drawings, in which:

FIG. 4 comprises (a) a schematic diagram of a dark field scatterometer for use in measuring targets using a first pair of illumination apertures, (b) a detail of diffraction spectrum of a target grating for a given direction of illumination;

DETAILED DESCRIPTION OF EMBODIMENTS

Before describing embodiments in detail, it is instructive to present an example environment in which embodiments may be implemented.

Figure 1:
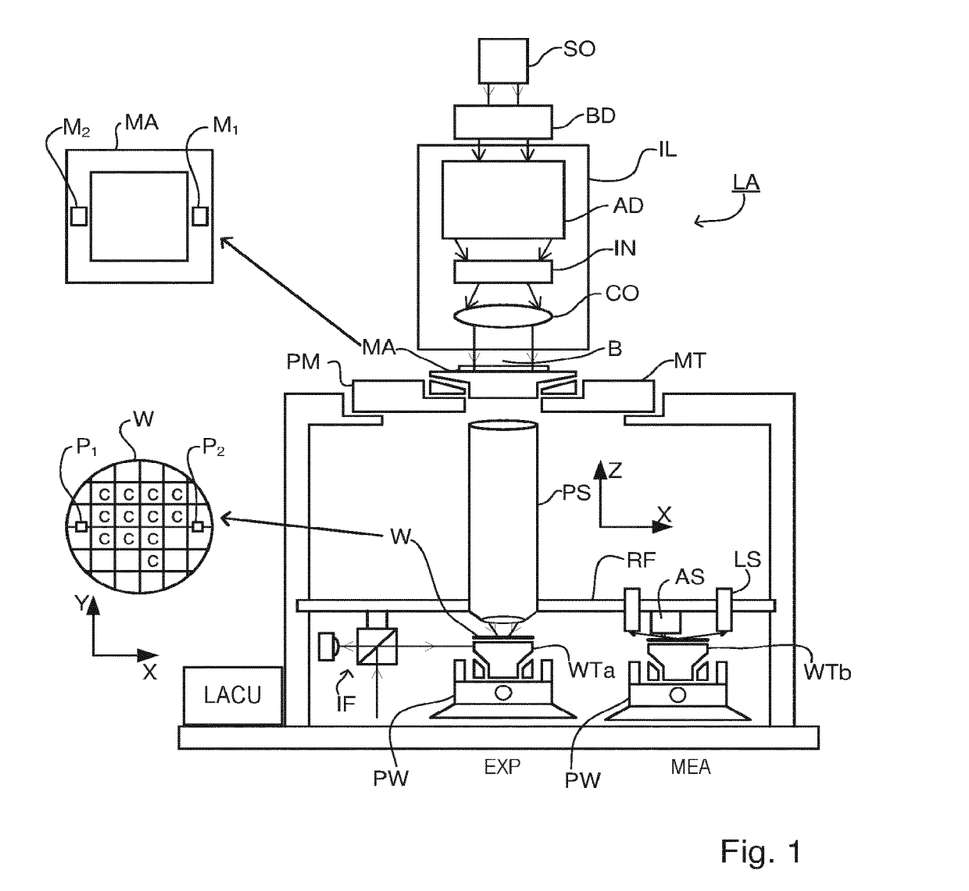
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B. e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
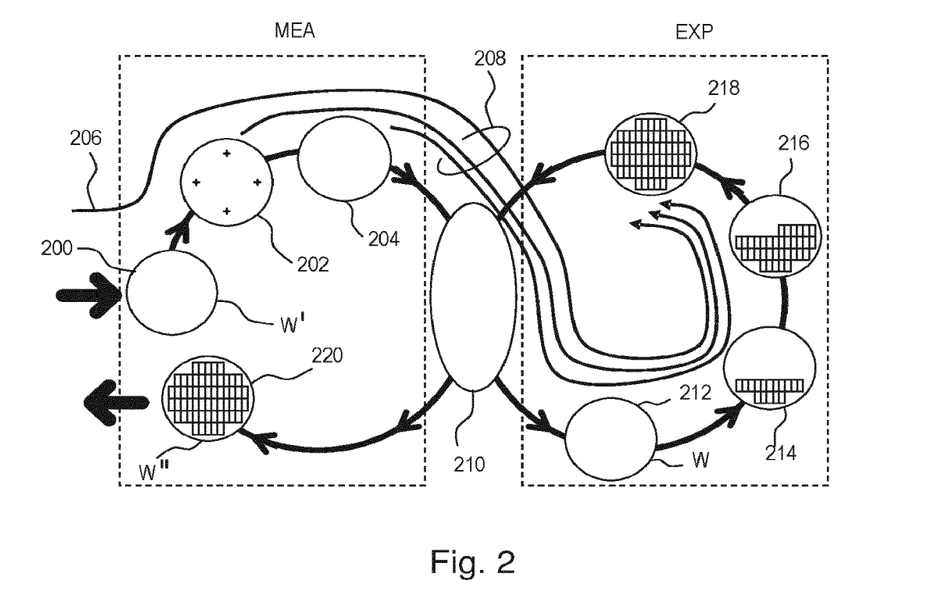
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a dry tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one example to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement or interleaved.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
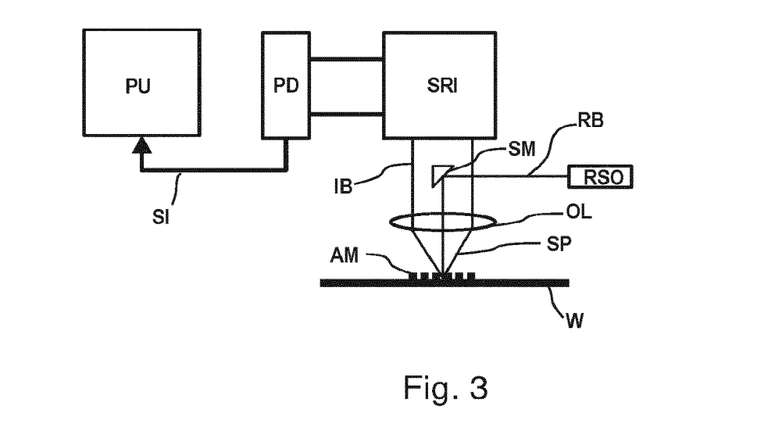
FIG. 3 is a schematic illustration of an alignment sensor adaptable according to some embodiments of the present disclosure.

FIG. 3 is a schematic block diagram of an example of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided. Improvements in performing and processing such multiple wavelength measurements are disclosed below.

A metrology apparatus is shown in FIG. 4(a). A target T and diffracted rays of measurement radiation used to illuminate the target are illustrated in more detail in FIG. 4(b). The metrology apparatus illustrated is of a type known as a dark field metrology apparatus. The metrology apparatus depicted here is purely exemplary, to provide an explanation of dark field metrology. The metrology apparatus may be a stand-alone device or incorporated in either the lithographic apparatus LA. e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 4(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 4(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 4(a), both the first and second illumination modes are illustrated, by designating diametrically opposite apertures labeled as north (N) and south(S). When the incident ray I of measurement radiation is from the north side of the optical axis, that is when the first illumination mode is applied using aperture plate 13N, the +1 diffracted rays, which are labeled +1 (N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term "image" is used here in a broad sense. An image of the grating lines as such will not be formed, if only one of the −1 and +1 orders is present.

Figure 4:
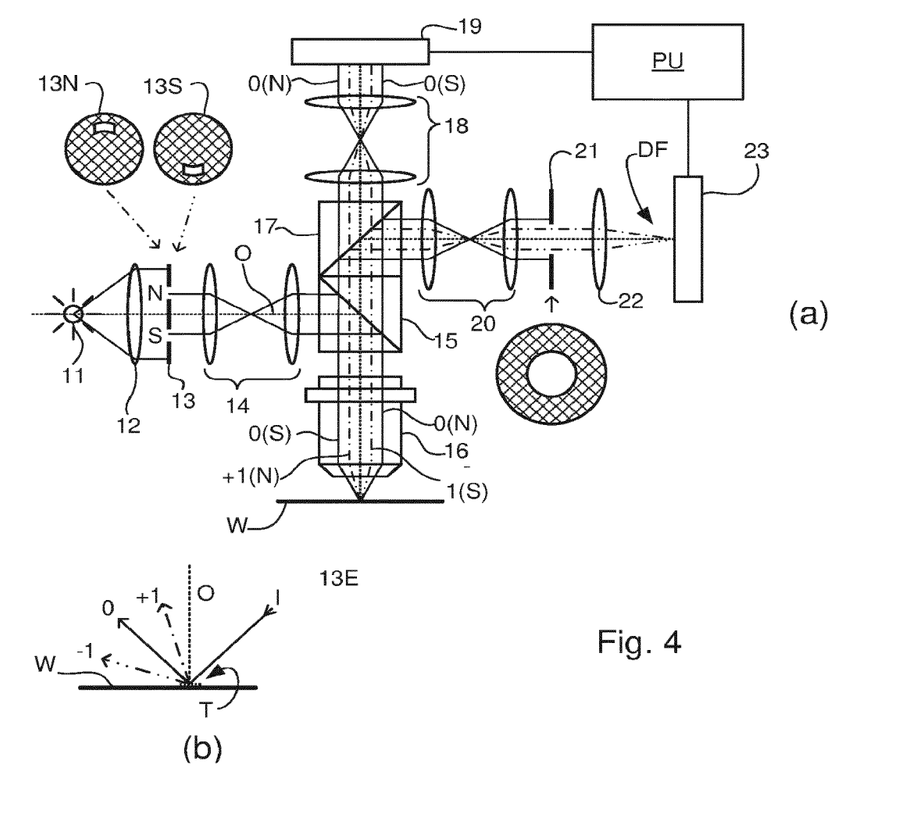

The particular forms of aperture plate 13 and field stop 21 shown in FIG. 4 are purely examples. In some embodiments, on-axis illumination of the targets is used, and an aperture stop with an off-axis aperture is used to pass substantially only one first order of diffracted light to the sensor. In other examples, a two quadrant aperture may be used. This may enable simultaneous detection of plus and minus orders, as described in US2010201963A1, mentioned above. Embodiments with optical wedges (segmented prisms or other suitable elements) in the detection branch can be used to separate the orders for imaging spatially in a single image, as described in US2011102753A1, mentioned above. In yet other embodiments, 2nd, 3rd and higher order beams (not shown in FIG. 4) can be used in measurements, instead of or in addition to the first order beams. In yet other embodiments, a segmented prism can be used in place of aperture stop 21, enabling both +1 and −1 orders to be captured simultaneously at spatially separate locations on image sensor 23.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented.

Metrology sensors include those designed predominately for pre-exposure metrology or alignment, such as the alignment sensor illustrated in FIG. 3, and those designed predominately for post-exposure metrology (e.g., overlay, CD and/or focus monitoring) such as the metrology apparatus illustrated in FIG. 4. In either case, it is often desirable to control the illumination spectrum, e.g., to switch the illumination between different wavelengths (colors) and/or wavefront profiles. More specifically, control of the illumination spectrum may comprise control of one or more of the following aspects of the illumination spectrum:

Tunable central frequency of a color band;
Tunable transmission of a color band;
Tunable bandwidth of a color band;
Switching of multiple color bands simultaneously on/off.

A number of methods are presently used for controlling the illumination spectrum. One such method comprises using an AOTF (acousto-optical tunable filter). However, using an AOTF has a number of disadvantages which include:

Out-of-band suppression is insufficient for some applications;
Limited flexibility in bandwidth control;
There is crosstalk between color bands if they are spaced close to each other.

Another method, which finds application for example in the apparatus of FIG. 4, comprises using color wheels which rotate different color filters into the beam path as required. However, the switching speed of such color wheels are slower than desired, and they offer little or no flexibility in any of the aspects of control of the illumination spectrum listed above.

One known method for spectral shaping comprises using spatial light modulation devices such as digital micromirror devices (DMDs). Arrangements using such devices are known which provide tunable central frequency and bandwidth of color bands and simultaneous switching of multiple bands. However, none of these devices are able to do all of this and also provide tunable transmission per color band.

As such, at least some of the disclosed embodiments describe an illumination arrangement that is able to provide tunable central frequency and bandwidth of color bands, simultaneous switching of multiple bands and tunable transmission per color band.

The illumination arrangement may comprise a beam expanding (or smearing) optical element, such as a (first) 1D beam expander, (first) beam dispersing element (e.g., a prism of grating) and a DMD. The beam expanding optical element is operable to enable the DMD to modulate the color and transmission (per color) of the dispersed illumination radiation. The modulated beam is subsequently combined e.g., using a second beam expanding optical element and second dispersing element in opposite configuration. A single mode spatial filter may be provided at the output to facilitate wavefront shaping of the transmission per color, while maintaining a single mode output and full transmission control (e.g. from 0-100%).

In some embodiments, the 1D beam expander expands the beam in a first direction and the dispersing element disperses the expanded beam in a second direction. The first direction may be substantially perpendicular to the second direction. In such a manner, the DMD (comprising a 2D array of micromirrors or pixels) is able to select color on one axis of the 2D array and transmission per color on the other axis of the 2D array. While such an arrangement is practical in terms of control, more complicated expanding and dispersive element arrangements (other than a 1D beam expander which is orthogonally oriented with respect to the dispersive element) are possible within the scope of this example. Such arrangements are possible provided that it is known which wavelength is controlled by each DMD pixel/micromirror.

Figure 5:
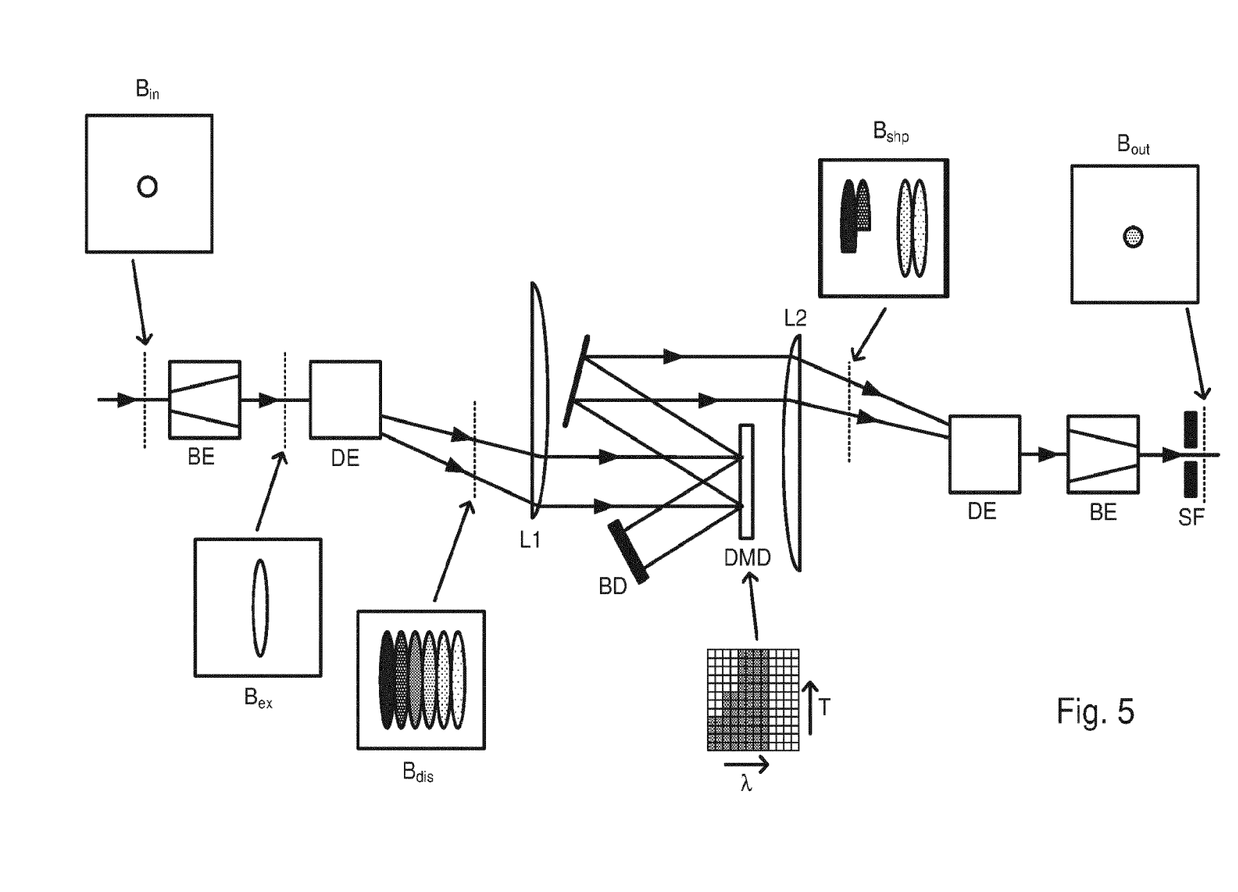
FIG. 5 is a schematic illustration of an illumination arrangement according to some embodiments of the present disclosure.

FIG. 5 illustrates an illumination arrangement according to such an example. A multiple wavelength (e.g., white light or broadband) input beam $B_{in}$ is expanded or spatially smeared in a first direction by beam expanding element BE (e.g., a 1D beam expanded) to obtain expanded beam $B_{ex}$. The 1D beam expander may, for example, comprise two cylindrical lenses/mirrors. The expanded beam $B_{ex}$ is dispersed by beam dispersing element DE (e.g., a prism or grating) to obtain dispersed (and expanded) beam $B_{dis}$. Note that in this example, the direction of dispersal by dispersing element DE is perpendicular to the expansion direction of the (e.g., 1D) beam expanding element BE. This is best understood by the Figure showing a cross section of the illumination beams $B_{in}$, $B_{ex}$ and $B_{dis}$ at the dotted lines at each stage of the arrangement. Note that the different shades of the different regions of the cross section of the dispersed beam $B_{dis}$ signify different colors/wavelengths and not intensities.

A DMD at a pupil plane of lens system L1, L2 is used to select colors and control the transmission of the dispersed beam $B_{dis}$. In this example, a first axis λ selects the colors (e.g., bands and/or bandwidth), while the second axis T sees the same spectrum, but switching pixels on this axis controls the transmission (e.g., per color or color band). A cross section of the DMD is shown in the Figure with a purely exemplary transmission pattern, where shaded pixels illustrate "off pixels" (i.e., oriented to reflect illumination to beam dump BD) and non-shaded pixels illustrate "on pixels" (i.e., oriented to reflect illumination to the output). The resulting shaped beam $B_{shp}$ is recombined via second beam expanding element BE and second dispersing element DE. It can be seen here that the pattern on the DMD has completely blocked (switched off) the two central wavelength bands (of the six bands of dispersed beam $B_{dis}$), attenuated transmission of the leftmost two wavelength bands to differing degrees, while the rightmost two wavelength bands are unattenuated.

The combined beam may then be projected onto a single-mode spatial filter SF (e.g., a pinhole or single-mode fiber, etc.), to provide an output beam $B_{out}$ with a fully controlled spectrum. If multimode input/output light is used, the spatial filter SF at the output may comprise a multimode filter (e.g., an iris or multimode fiber).

The transmission axis T on the DMD may be used for wavefront shaping per color to optimize transmission through the pinhole per color. A full dynamic range control from 0 to 100% may be possible.

The presented configuration is a transmission configuration. Of course, reflective configurations are also possible, so as to minimize absorption by the optical elements.

In some embodiments, it may be possible to use the same dispersive element and beam expander for dispersion, expanding and recombination. However, this may lead to more crosstalk between spectral components, which is undesirable.

The order of the optical elements (i.e., beam expander and dispersive element) may be swapped in order depending on the optical design.

In all embodiments disclosed herein, the DMD can be replaced by other SLM devices; however the fast switching of a DMD may make such a device preferable.

The DMD can be replaced by other SLM devices; however the fast switching of a DMD may make such a device preferable. For example, other such SLM devices may comprise those which control the phase per pixel. This type of SLM may be used for spatially coherent illumination to reshape the diffracted wavefront, which (for example) can facilitate a programmable spot size on the spatial filter. The combination of programmable spot size and filter determines the transmission. This may be performed for every color. Another type of SLM which may be used is that which controls the absorption per pixel. The operating principles are essentially the same as the described configuration using a DMD. Also, a deformable mirror may be used to perform the spatial modulation and therefore, in the context of this disclosure, the term SLM also includes a deformable mirror.

Figure 6:
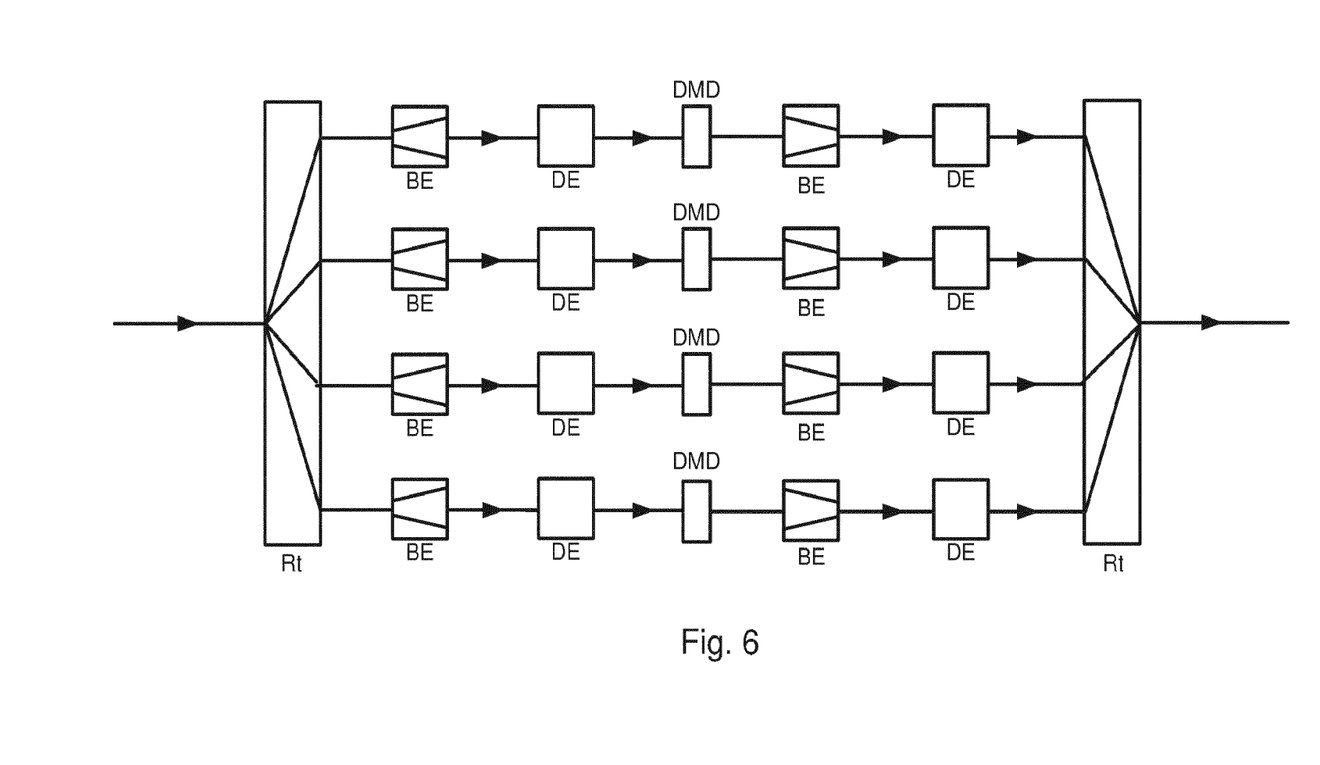
FIG. 6 is a schematic illustration of a multiple channel variation of the illumination arrangement of FIG. 5.

FIG. 6 shows an example arrangement comprising a first router Rt which splits the beam into multiple channels (the Figure shows four channels although this is purely an example) and a second router Rt which recombines the channels. Each channel (shown in simplified form as comprising two beam expanding elements BE, two dispersing elements DE and a DMD) may comprise an arrangement as depicted in FIG. 5. Such an arrangement may provide better control of a specific part of the spectrum and/or control of the polarization or other illumination parameter. For example, depending on the optical design it may be desirable to implement separate channels for orthogonal polarizations so as to deal with birefringent effects, etc. As such, at least some of the different channels may comprise polarization specific channels. The routers Rt may comprise static elements, for example: beam splitters, polarizing beam splitters, dichoic mirrors. Alternatively, the routers Rt may comprise dynamic elements, for example: a DMD, acousto-optical switch, etc.

This first main example may be more relevant for non-stationary sensors such as alignment sensors of the type illustrated by FIG. 3, rather than stationary sensors (such as illustrated in FIG. 4), where the dose can be controlled by dynamic control of the pixel values. However, this example may be more relevant for stationary sensors if combined with a non-stationary element, such as a dynamic coherence scrambler. Also, the fact that the DMD can be used to switch between on and off states rapidly means it can be used to control the transmission with stationary sensors to control the transmission of a color as observed by the camera. As such, this example may be used with any suitable non-stationary or stationary sensor or metrology apparatus.

Another example for an illumination arrangement will now be described. Such an example is proposed for fast color switching in a metrology apparatus such as illustrated in FIG. 4. In particular, the example provides fast color switching and simultaneous pupil switching in such a metrology apparatus, whereas presently it is typically the case that switching colors necessitates an aperture switch (e.g., aperture 13, which may also be a quartered aperture plate for simultaneous illumination in opposing directions) to ensure that the first diffraction orders are properly captured. Whether a quartered aperture plate is used or the aperture plates 13N, 13S illustrated in FIG. 4, the size and shape of the apertures typically needs to be changed as wavelength is changed, which typically necessitates a physical aperture plate swap.

The illumination arrangement may be optimized for providing spatially incoherent radiation and as such may comprise a lens array having respective lenses for each of a number of specific wavelengths or wavelength bands which direct the illumination to a SLM such as a DMD in a spectrally resolved manner.

Figure 7:
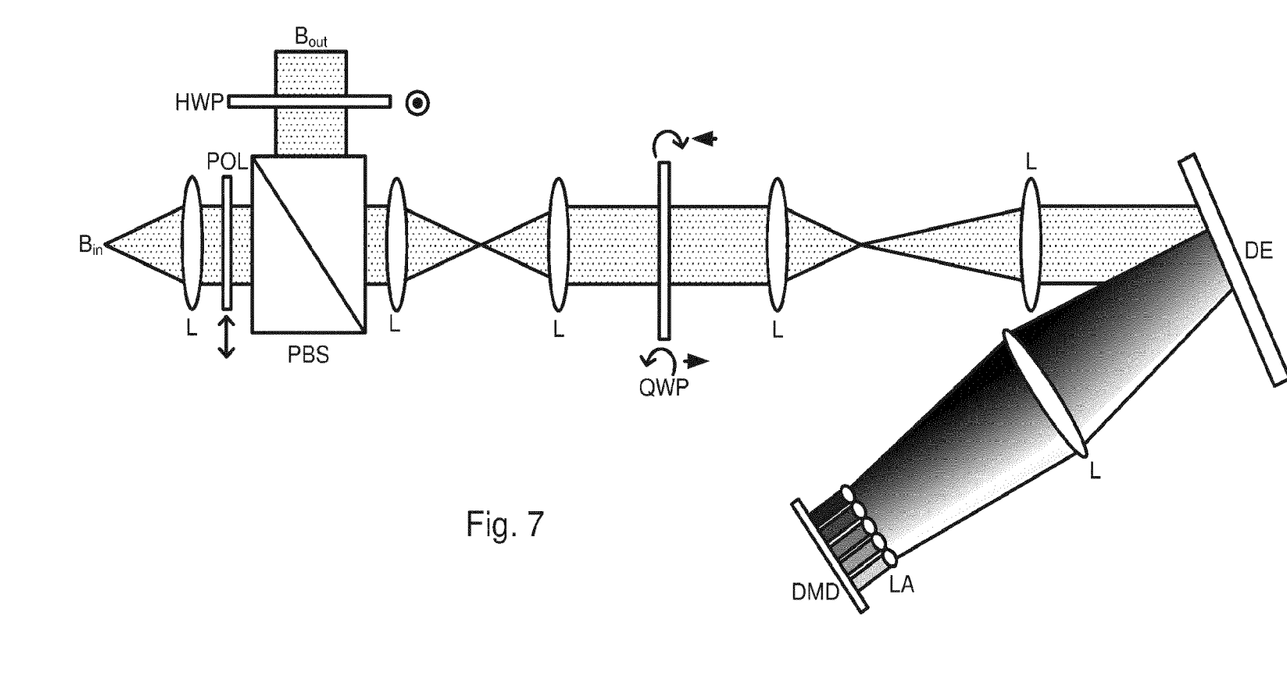
FIG. 7 is a schematic illustration of an illumination arrangement according to some embodiments of the present disclosure.

FIG. 7 is a schematic illustration of such an example. An input beam $B_{in}$ is polarized by polarizer POL and then transmitted through polarizing beamsplitter PBS. A quarter wave plate QWP imposes a circular or elliptical polarization to the beam. A dispersing element DE disperses the beam according to wavelength and a lens array LA (or micro-lens array) directs the dispersed radiation onto a DMD located at a (conjugate) pupil plane of the objective lens of the metrology apparatus. Each lens of the lens array directs a respective spectral portion of the dispersed radiation to form a pupil image on the spectrally resolved conjugate pupil plane. The lens array LA enables spatially incoherent radiation to be switched and shaped by the apparatus of this example.

The DMD shapes the beam wavefront and its spectral properties. Furthermore, the handedness of the circular polarization has become orthogonal (e.g., right-handed circular polarized) to its original state (e.g., left-handed circular polarized) due to the interaction with dispersing element DE and DMD. Because of this, the spectrally shaped beam on the return pass has its polarization linearized by quarter wave plate QWP to a polarization state orthogonal to that imposed by polarizer POL (i.e., perpendicular with respect to its initial pass). As such, the effect of the (optional) quarter wave plate QWP and other polarizer elements is to maximize the amount of illumination (from the DMD) which is reflected into the output beam $B_{out}$ by beamsplitter PBS. The quarter wave plate QWP is preferably achromatic. A half wave plate HWP may also be provided on the output beam $B_{out}$ path.

The dispersing element DE may be a blazed grating to maximize the illumination contained in the first diffraction orders. Alternatively other types of grating or a prism may be used.

The effect of the micro-lens array and dispersing element is to provide separate pupil images on the DMD, each image being formed from a respective different color or color band. In addition, as the DMD is at the conjugate pupil plane, it takes the place of the aperture of FIG. 4. As such, simultaneously with shaping the spectrum of the beam, the spatial shape of the illumination can also be adjusted to a desired profile. For example, the desired profile may be such to ensure that the desired orders (e.g., first diffraction orders) are properly captured and/or no additional higher orders are captured. Therefore, the illumination aperture profile may be directly configured via the DMD, and separately for each of the wavelength bands (i.e., each pupil image). The DMD can modify the shape and intensity, and switch on/off each of the pupil images corresponding to different colors. This arrangement can also be used for color multiplexing.

In the context of FIG. 4, such an illumination arrangement may replace aperture 13 at the illumination branch of the apparatus.

It should be appreciated that the term color is used throughout this text synonymously with wavelength and the colors may include those outside the visible band (e.g., infrared or ultraviolet wavelengths).

While specific embodiments have been described above in various examples, it will be appreciated that other embodiments may be practiced.

Although specific reference may have been made above to the use of embodiments of the present disclosure in the context of optical lithography, it will be appreciated that the embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present disclosure should not be limited by any of the above-described exemplary embodiments but should be defined only in accordance with the following claims and their equivalents.

The invention claimed is:

1. An illumination arrangement for spectrally shaping a broadband illumination beam to obtain a spectrally shaped illumination beam, comprising:
a beam dispersing element for dispersing the broadband illumination beam;
a spatial light modulator for spatially modulating the broadband illumination beam subsequent to being dispersed;
and at least one of:
a beam expanding element for expanding said broadband illumination beam in at least one direction, located between an input of the illumination arrangement and the spatial light modulator, wherein the beam expanding element comprises a 1 dimensional beam expanding element for expanding the beam substantially in a first direction, wherein the direction of dispersal of the beam dispersing element is in a second direction perpendicular to said first direction, such that a first axis of the spatial light modulator controls spectral components comprised within the spectrally shaped illumination beam and a second axis of the spatial light modulator controls transmission per wavelength or wavelength band of the spectrally shaped illumination beam; and
a lens array, each lens of which for directing a respective wavelength band of the broadband illumination beam subsequent to being dispersed onto a respective region of the spatial light modulator.

2. The illumination arrangement of claim 1, wherein the spatial light modulator comprises a digital micromirror device.

3. The illumination arrangement as claimed in of claim 2, comprising said lens array being operable to provide a plurality of separate pupil images on the spatial light modulator, each pupil image comprising a different wavelength band.

4. The illumination arrangement of claim 3, wherein control of the spatial light modulator simultaneously controls spectral components comprised within the spectrally shaped illumination beam and a configuration of an illumination aperture profile.

5. The illumination arrangement of claim 4, wherein control of the configuration of the illumination aperture profile enables optimization of the illumination aperture for selected one or more spectral components.

6. The illumination arrangement of claim 3, wherein said spectrally shaped illumination beam comprises incoherent illumination.

7. The illumination arrangement of claim 3, wherein the beam path to and from the spatial light modulator is shared, and comprising a beamsplitter to separate an input beam and said spectrally shaped illumination beam.

8. The illumination arrangement of claim 7, wherein the beamsplitter is a polarizing beamsplitter and the illumination arrangement further comprises:
a polarizer for linearly polarizing the input beam; and
a quarter wave plate between said polarizing beamsplitter and spatial light modulator.

9. The illumination arrangement of claim 1, wherein control of the spatial light modulator controls which wavelengths are comprised within the spectrally shaped illumination beam and transmission per wavelength or wavelength band of the spectrally shaped illumination beam.

10. The illumination arrangement of claim 1, comprising a first beam expanding element and first beam dispersing element to expand and disperse the beam before the spatial light modulator and a second beam expanding element and second beam dispersing element to recombine the beam subsequent to the spatial light modulator.

11. The illumination arrangement of claim 1, comprising a plurality of separate channels and a router for distributing the illumination between the channels depending on an illumination parameter of the illumination, each channel comprising at least one beam expanding element, at least one beam dispersing element and a spatial light modulator.

12. The illumination arrangement of claim 1, comprising a spatial filter for filtering the spectrally shaped illumination beam.

13. The illumination arrangement of claim 1, wherein the beam dispersing element comprises a grating.

14. A metrology device comprising the illumination arrangement of claim 1, wherein the illumination arrangement is configured to provide measurement illumination.

15. The metrology device of claim 14, wherein the metrology device comprises a scatterometer.

16. The metrology device of claim 15, comprising:
a support for a substrate;
an optical system for directing said measurement illumination to a structure on said substrate; and
a detector for detecting measurement radiation scattered by the structure on the substrate.

17. The metrology device of claim 16, wherein the illumination arrangement is located at a conjugate pupil plane of the optical system.

18. The metrology device of claim 14, wherein the metrology device comprises a position sensor.

19. A lithographic apparatus comprising:
a patterning device support for supporting a patterning device;
a substrate support for supporting a substrate; and
the metrology device of claim 18 being operable to perform alignment of said patterning device and/or said substrate support.

* * * * *